United States Patent
Kamikawa et al.

(10) Patent No.: US 6,725,868 B2
(45) Date of Patent: Apr. 27, 2004

(54) LIQUID PROCESSING APPARATUS

(75) Inventors: Yuji Kamikawa, Tosu (JP); Koji Egashira, Tosu (JP)

(73) Assignee: Tokyo Electron Limited, Tokyo-To (JP)

( * ) Notice: Subject to any disclaimer, the term of this patent is extended or adjusted under 35 U.S.C. 154(b) by 188 days.

(21) Appl. No.: 09/987,369

(22) Filed: Nov. 14, 2001

(65) Prior Publication Data
US 2002/0056471 A1 May 16, 2002

(30) Foreign Application Priority Data

Nov. 14, 2000 (JP) ........................ 2000-346617
Nov. 14, 2000 (JP) ........................ 2000-346618

(51) Int. Cl.$^7$ ............................................. B08B 3/02
(52) U.S. Cl. ................. 134/99.1; 134/100.1; 134/102.3; 134/198; 134/200; 134/902
(58) Field of Search ............................ 134/200, 99.1, 134/100.1, 102.3, 103.2, 198, 148, 157, 902

(56) References Cited

U.S. PATENT DOCUMENTS

| 4,300,581 | A | | 11/1981 | Thompson |
| 4,745,422 | A | * | 5/1988 | Matsuoka et al. |
| 5,001,084 | A | * | 3/1991 | Kawai et al. |
| 5,022,419 | A | | 6/1991 | Thompson et al. |
| 5,351,360 | A | * | 10/1994 | Suzuki et al. |
| 5,431,179 | A | * | 7/1995 | Miyazaki et al. |
| 5,678,320 | A | | 10/1997 | Thompson et al. |
| 5,784,797 | A | | 7/1998 | Curtis et al. |
| 5,972,127 | A | * | 10/1999 | Thompson et al. |
| 5,989,355 | A | * | 11/1999 | Brandt et al. |
| 6,039,057 | A | * | 3/2000 | Doran |
| 6,375,741 | B2 | * | 4/2002 | Reardon et al. |
| 6,431,948 | B1 | * | 8/2002 | Atoh |
| 6,503,335 | B2 | * | 1/2003 | Hohl et al. |

FOREIGN PATENT DOCUMENTS

| JP | 60-14244 | * | 1/1985 |
| JP | 5-47727 | * | 1/1993 |
| JP | 4-45574 | * | 2/1995 |
| JP | 7-3350607 | * | 12/1995 |
| JP | 8-241853 | * | 9/1996 |
| JP | 10-163150 | * | 6/1998 |
| JP | 11-16864 | * | 1/1999 |
| JP | 11-76962 | * | 3/1999 |
| JP | 2000-77498 | * | 3/2000 |
| JP | 2001-77075 | | 3/2001 |

* cited by examiner

Primary Examiner—Frankie L. Stinson
(74) Attorney, Agent, or Firm—Smith, Gambrell & Russell, LLP

(57) ABSTRACT

A cleaning processing apparatus, which is one embodiment of a liquid processing apparatus for performing a liquid processing by supplying a predetermined process liquid to a target object to be processed such as a semiconductor wafer while rotating the target object, comprises a rotor for holding wafers W, a slidable process section for housing the rotor, and a cleaning liquid spurting nozzle for supplying a predetermined cleaning liquid to the wafers W. A housing for housing the slidable process section is of a hermetic structure so as to be substantially shielded from the outside.

32 Claims, 10 Drawing Sheets

LIQUID PROCESSING APPARATUS

BACKGROUND OF THE INVENTION

1. Field of the Invention

The present invention relates to a liquid processing apparatus for applying a predetermined liquid processing or a predetermined drying processing to various substrates such as a semiconductor wafer and a liquid crystal display (LCD) substrate.

2. Description of the Related Art

In the manufacturing process of, for example, a semiconductor device, used is a wafer cleaning apparatus for cleaning a semiconductor wafer used as a substrate by using a cleaning liquid such as a predetermined chemical liquid or a pure water so as to remove contaminants such as particles, an organic contaminant, and metal impurities from the wafer or for drying the wafer by removing liquid droplets from the wafer by using an inert gas such as a nitrogen gas ($N_2$) or a volatile and highly hydrophilic IPA vapor. Known is a wafer cleaning apparatus of this type, wherein a plurality of wafers are introduced into in a wafer cleaning/drying chamber for processing these wafers in a batch system.

A wafer cleaning apparatus is disclosed in, for example, U.S. Pat. Nos. 5,784,797 and 5,678,320. The wafer cleaning apparatus disclosed in each of these prior arts includes a rotor having wafers held therein, a wafer cleaning/drying chamber having a wafer delivery port formed on the front wall facing a wafer transfer arm when the wafer transfer arm has been moved toward the wafer cleaning/drying chamber, and a wafer cleaning mechanism wherein a wafer chuck of the wafer transfer arm is moved into the wafer cleaning/drying chamber through the wafer delivery port so as to deliver the wafer held by the wafer chuck into the rotor, or wherein the wafer held by the rotor is received by the wafer chuck.

Conventionally, the wafer cleaning/drying chamber itself was of a hermetic structure so as to prevent leakage of the cleaning liquid. However, the housing having the wafer cleaning/drying chamber arranged therein was not of a hermetic structure.

It should be noted in this connection that the cleaning liquid may possibly leak to the outside through, for example, the joints of the members constituting the wafer cleaning/drying chamber. Further, where the wafer rotated at a high speed has been broken, the wafer cleaning/drying chamber may be damaged by the broken pieces of the wafer so as to cause leakage of the cleaning liquid. Furthermore, the process liquid leaking from the housing may leak further from within the cleaning process chamber to the outside.

The process liquid leaking from the wafer processing/drying chamber or from the housing is likely to bring about a disorder in the mechanical system or the electrical system arranged within the wafer cleaning apparatus. Further, when the leaking cleaning liquid is flammable, a fire may breaks out in the wafer cleaning apparatus. Further, the broken pieces of the wafer cleaning/drying chamber may be scattered so as to damage the other adjacent processing sections. If the damage is extended to the entire wafer cleaning apparatus, it takes much time to repair the wafer cleaning apparatus, and the repair becomes costly.

What should also be noted is that it is necessary to maintain periodically the wafer cleaning mechanism. When the wafer has been broken or leakage of the cleaning liquid has taken place during the cleaning process, it is necessary to clean or repair the wafer cleaning mechanism by interrupting the cleaning process. Therefore, it is desirable that the wafer cleaning mechanism can be easily accessed. However, in the wafer cleaning mechanism disclosed in U.S. Pat. Nos. 5,784,797 and 5,678,320 quoted above, the wafer cleaning mechanism can not be accessed except from the front wall of the housing when the rotor is attached or detached for the maintenance purpose. Therefore, the maintenance is not easy.

BRIEF SUMMARY OF THE INVENTION

A first object of the present invention is to provide a liquid processing apparatus excellent in reliability, wherein an accident occurring in the housing does not affect another mechanism or process section within the liquid processing apparatus.

Further, a second object of the present invention is to provide a liquid processing apparatus that facilitates the access to the liquid processing mechanism, wherein a target object to be processed is subjected to a liquid processing so as to facilitate the maintenance.

According to a first aspect of the present invention, there is provided a liquid processing apparatus, comprising a liquid processing section for performing a liquid processing by supplying a predetermined process liquid to a target object while rotating the target object; and a housing for housing said liquid processing section; wherein said housing has a hermetic structure which is substantially shielded from the outside.

In the liquid processing apparatus according to the first aspect of the present invention, the housing for housing the liquid processing section for applying a liquid processing to the target object has a hermetic structure. Therefore, even if the process liquid leaks from the process chamber, it is possible to avoid such an accident that the leaking process liquid flows into another process section and is diffused so as to damage the other process section.

Further, even when the process liquid leaking from the process chamber brings about a fire within the liquid processing section, it suffices to fight the fire only within the liquid processing section so as to make it possible to prevent the other process section within the liquid processing apparatus from catching fire and receiving damage.

Further, even when the target object and the apparatus such as a process chamber within the liquid processing section have been broken and the broken pieces have been scattered, the broken pieces are prevented from being scattered from within the housing. As a result, the other process sections constituting the liquid processing apparatus are prevented from being damaged. It follows that it is possible to restore the entire liquid processing apparatus to a usable state by repairing only the damaged liquid processing section, thereby reducing the repairing time and the number of parts that are replaced so as to reduce the cost required for repairing the liquid processing apparatus.

What should also be noted is that, since the housing has a hermetic structure, the housing is unlikely to be affected by the other process sections and by the external environment so as to make it possible to maintain a constant environment, e.g., a constant temperature, within the housing. It follows that, in the case of using a process liquid of a high temperature, it is possible to set an environment within the housing in accordance with the temperature of the process liquid so as to inhibit the cooling of the process liquid. As a result, it is possible to carry out an effective liquid processing by fully utilizing the characteristics of the process liquid.

According to a second aspect of the present invention, there is provided a liquid processing apparatus for applying a predetermined liquid processing to a target object to be processed, comprising a cylindrical process chamber for housing the target object; and a liquid processing mechanism for performing a liquid processing by supplying a predetermined process liquid to said target object while rotating the target object housed in the process chamber; wherein the liquid processing mechanism is accessed from at least the side wall.

According to a third aspect of the present invention, there is provided a liquid processing apparatus for applying a predetermined liquid processing to a target object to be processed, comprising a liquid processing section including a cylindrical process chamber for housing the target object and a liquid processing mechanism for performing a liquid processing by supplying a process liquid to said target object while rotating said target object; a container delivery section for delivering a container capable of housing said target object; a transfer mechanism for transferring the target object between said container delivery section and said liquid processing section; and a detachable panel providing a partition wall between said container delivery section and said liquid processing section; wherein it is possible to gain access to the liquid processing mechanism from the sideward direction of said process chamber and from the direction of said container delivery section by detaching said panel.

In the liquid processing apparatus according to the second and third aspects of the present invention, it is possible for the worker or the cleaning machine to access the liquid processing mechanism or the liquid processing section in the event of the maintenance for recovering a malfunction or for cleaning the liquid processing mechanism from at least the side wall, or from the front wall, if need be. Therefore, the maintenance becomes easy. It follows that the maintenance time can be reduced, and the cleaning or the like can be performed in detail in the back region and the small spaces.

Further, in order to improve the maintainability in the cleaning of, for example, the floor of the casing having the liquid processing mechanism and the liquid process section installed thereon, it is possible to maintain a good environment inside the casing, thereby decreasing the amount of the particles or the like attached to the target object to be processed so as to improve the quality of processed target object. Incidentally, such a maintainability can be further improved by using a sliding type chamber.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detail description of the preferred embodiments given below, serve to explain the principles of the invention.

DETAILED DESCRIPTION OF THE INVENTION

The liquid processing apparatus of the present invention will now be described with reference to the accompanying drawings. The following description covers as an example a cleaning processing apparatus 1 of a semiconductor wafer according to one embodiment of the liquid processing apparatus of the present invention.

Figure 1:
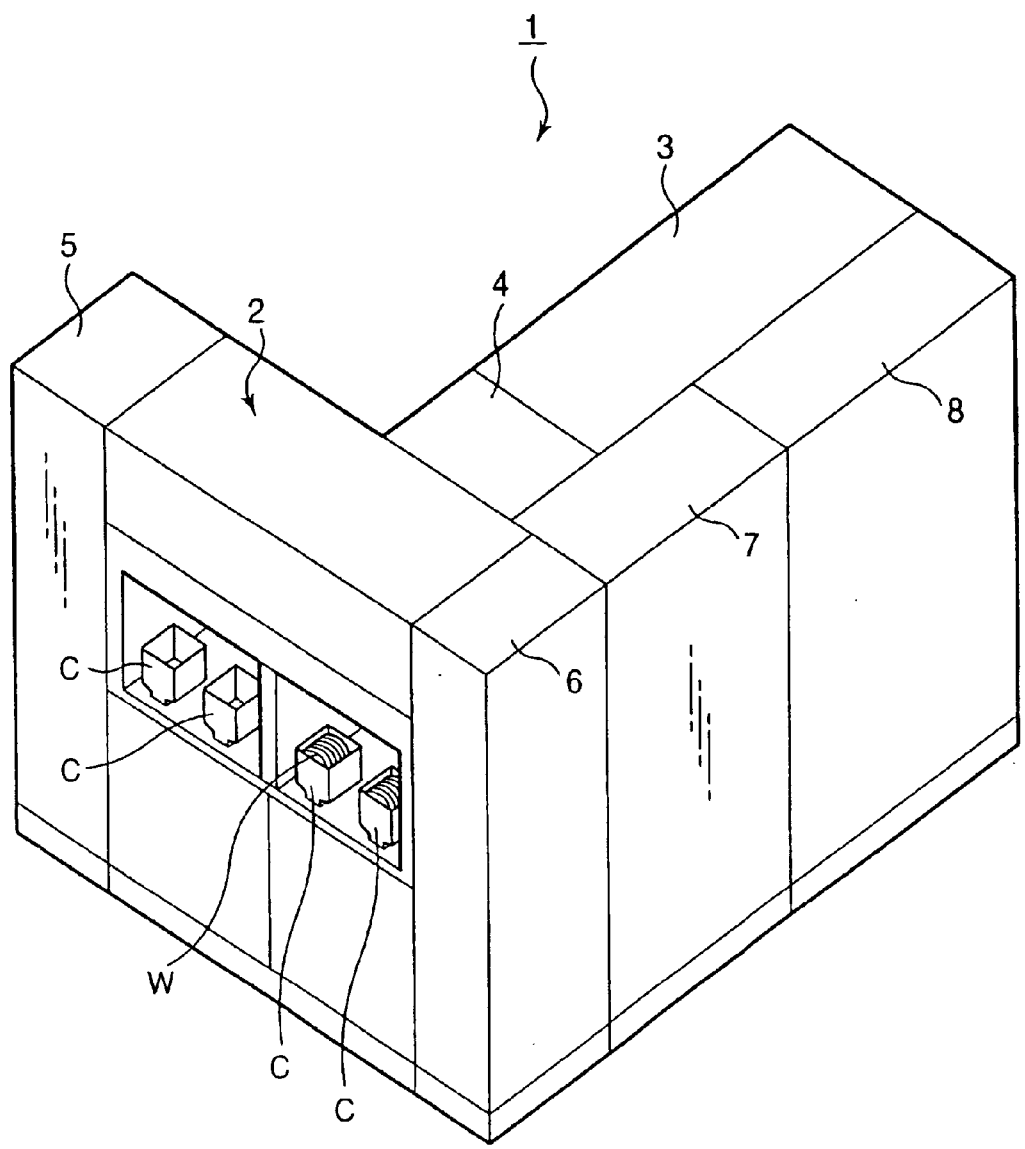
FIG. 1 is an oblique view showing an outer appearance of a cleaning processing apparatus according to a first embodiment of the liquid processing apparatus of the present invention.
Figure 2:
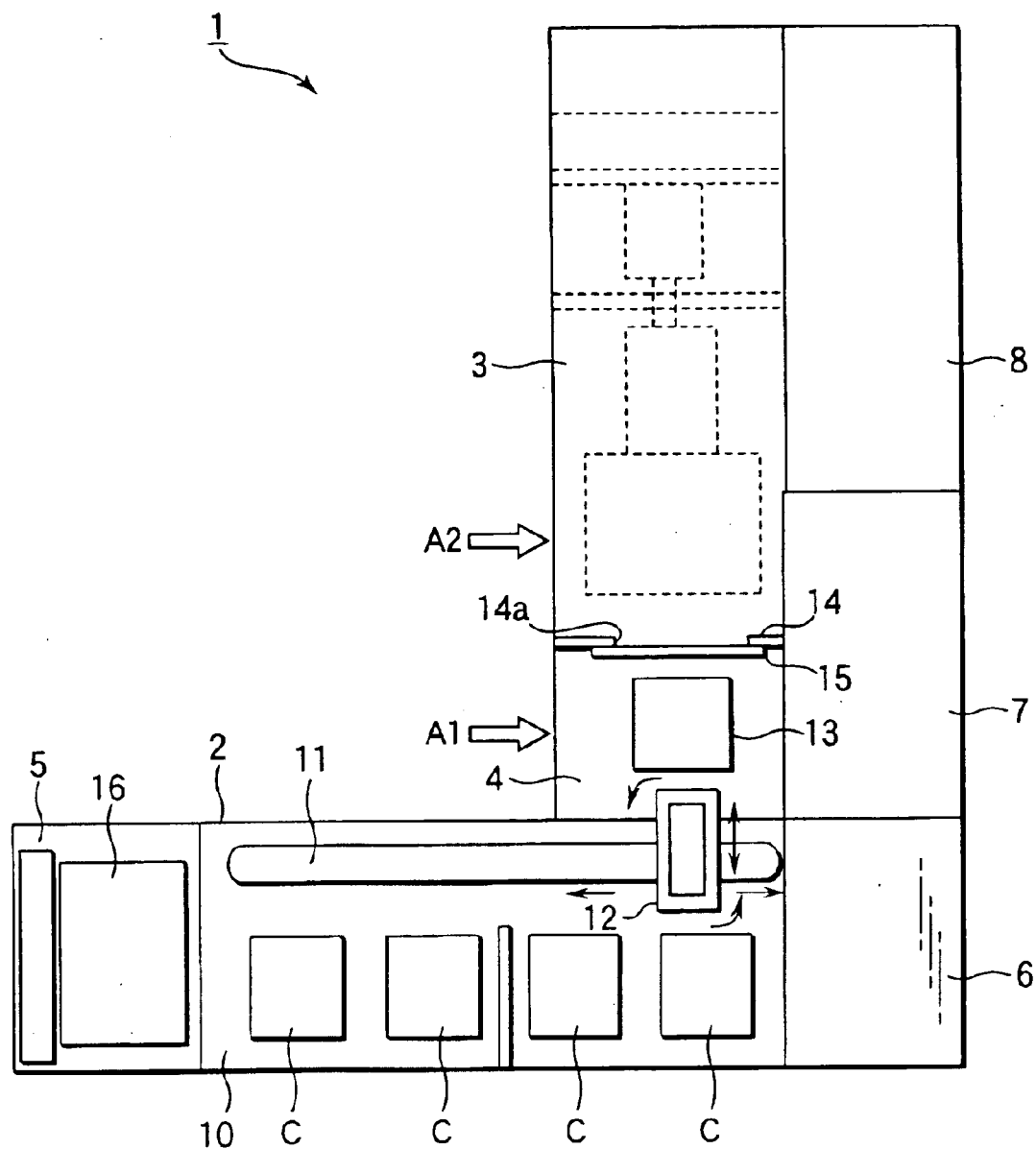
FIG. 2 is a plan view of the cleaning processing apparatus shown in FIG. 1.

FIG. 1 is an oblique view of the cleaning processing apparatus 1, and FIG. 2 is a plan view of the cleaning processing apparatus 1. As shown in FIGS. 1 and 2, the cleaning processing apparatus 1 comprises an in/out port (container delivery section) 2 for delivering a carrier C, which is a container capable of housing wafers W, a cleaning processing unit 3 for applying a cleaning treatment to the wafers W, a wafer delivery unit 9, which is not shown in FIGS. 1 and 2 but shown in FIG. 3A, arranged below and apart from the cleaning processing unit 3, and a carrier relay unit 4 arranged between the wafer delivery unit 9 and the in/out port 2 for delivering the wafers W to and from the wafer delivery unit 9.

Further, the cleaning processing apparatus 1 comprises a carrier cleaning unit 5 for cleaning the carrier C, a carrier stock unit 6 for stocking a plurality of carriers C, a power source unit 7, and a chemical tank box 8 storing a predetermined process liquid to be supplied to the cleaning processing unit 3.

The in/out port 2 includes a table 10 on which four carriers C can be disposed, and a first carrier transfer mechanism 12 for transferring the carriers C disposed on the table 10 to the carrier relay unit 4 and for transferring the carriers C disposed on the carrier relay unit 4 onto the table 10. A plurality of wafers W, e.g., 26 wafers W, can be housed in the carrier C, and the carrier C is disposed on the table 10 where the surfaces of the wafers W are vertically aligned.

The carrier cleaning unit 5 includes a carrier cleaning vessel 16. The carrier C from which the wafers have been taken out in the wafer delivery unit 9 is transferred by the first carrier transfer mechanism 12 and a second carrier transfer mechanism 17 referred to herein later into the carrier cleaning vessel 16 for receiving a cleaning treatment.

The carrier stock unit 6 is capable of stocking a plurality of carriers C in the vertical direction. Specifically, the carrier C housing uncleaned wafers W or the carrier C from which the uncleaned wafers W have been taken out is temporarily stored in the carrier stock unit 6. The vacant carrier C for housing the wafers W after the cleaning treatment is also stored temporarily in the carrier stock unit 6. A carrier moving mechanism for disposing a predetermined carrier C within the carrier stock unit 6 on the table 10 or for stocking a carrier C in a predetermined position within the carrier stock unit 6 is arranged within the carrier stock unit 6.

The carrier relay unit 4, the wafer delivery unit 9 and the cleaning processing section 3 will now be described with reference to FIGS. 3A, 4 and 5 as well as FIGS. 1 and 2. A process chamber 26 is arranged within the cleaning processing unit 3. In the example shown in the drawing, the process chamber 26 is of a double wall structure comprising an outside chamber 26a and an inside chamber 26b that can be housed in the outside chamber 26a.

Figure 3A:
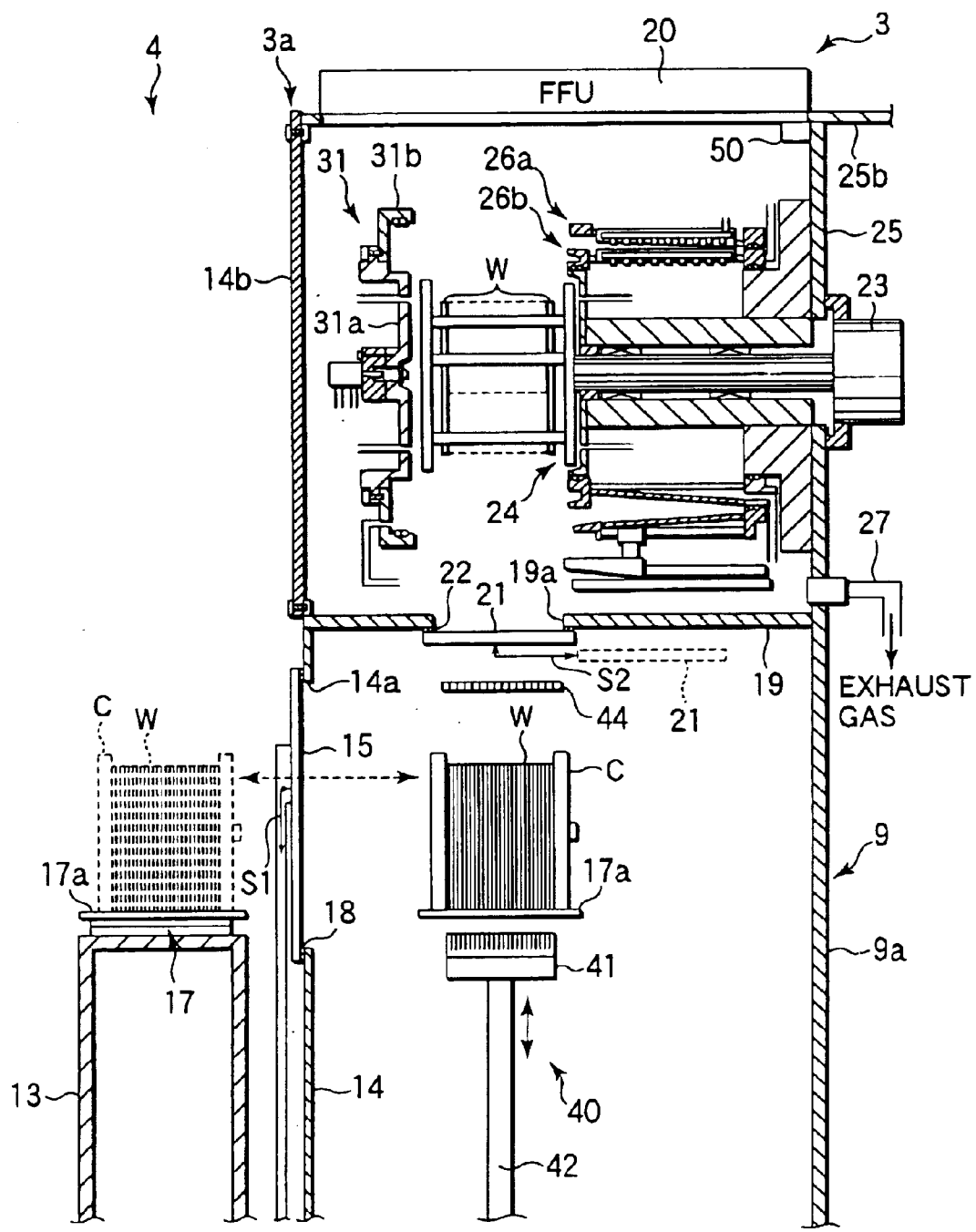
FIG. 3A is a cross sectional view schematically showing the structure in one embodiment regarding a carrier relay section, a wafer delivery section and a cleaning processing unit included in the cleaning processing apparatus shown in FIG. 1.

FIG. 3A is a cross sectional view showing the arrangement of the carrier relay unit 4, the wafer delivery unit 9 and the cleaning processing unit 3. FIGS. 4 and 5 are cross sectional views collectively showing the process chamber 26 arranged within the cleaning processing unit 3. FIG. 4 shows the state that the inside chamber 26b is withdrawn from within the outside chamber 26a (the position of the inside chamber 26b under such a particular state being hereinafter referred to as a "retreat position"), while FIG. 5 shows the state that the inside chamber 26b is positioned inside the outside chamber 26a (the position of the inside chamber 26b under such a particular state being hereinafter referred to as a "process positions"). FIG. 3A shows the state that both the outside chamber 26a and the inside chamber 26b are in the retreat positions.

A stage 13 is arranged within the carrier relay unit 4 and the second carrier transfer mechanism 17 referred to previously is arranged on the stage 13, as shown in FIG. 3A. The second carrier transfer mechanism 17 includes an arm 17a capable of holding the carrier C and capable of being moved toward and away from the wafer delivery unit 9 by an elongating-shrinking mechanism (not shown). Incidentally, a hole (not shown) is formed in the central portion of the arm 17a so as to allow a wafer holding member 41 referred to herein later and a supporting rod 42 for supporting the wafer holding member 41 to move in the vertical direction.

The carrier transfer mechanism 17 includes an inverting mechanism (not shown) capable of changing the direction of the carrier C disposed on the arm 17a by 180°. When the carrier C on the table 10 is disposed on the arm 17a by swinging the carrier transfer arm of the first carrier transfer mechanism 12, the direction of the carrier C on the arm 17a is opposite to that when the carrier C is disposed on the table 10. Therefore, the inverting mechanism is used in this case for bringing the direction of the carrier C back to the original direction. The inverting mechanism is similarly used when the carrier C is brought from the arm 17a back onto the table 10.

The wafer delivery unit 9 includes a housing 9a and a wafer delivery mechanism 40 arranged within the housing 9a. The wafer delivery mechanism 40 has the wafer holding member 41 for holding the wafer W, the support rod 42 for supporting the wafer holding member 41, and a lift drive mechanism (not shown) for vertically moving the wafer holding member 41 through the support rod 42.

A carrier transfer port 14a through which the carrier C and the arm 17a can be passed is formed in the partition wall 14 provided on the side of the carrier relay unit 4 in the housing 9a as shown in FIG. 3A. The carrier transfer port 14a can be closed by a plate 15 on the side of the carrier relay unit 4.

The plate 15 as shown in FIG. 3A is movable both in the horizontal direction and the vertical direction as denoted by an arrow S1. The plate 15 is brought into tight contact with the partition wall 14 with a seal member 18 interposed therebetween by, for example, an air cylinder (not shown) serving to move the plate 15 in the horizontal direction so as to hermetically close the carrier transfer port 14a.

As described above, the carrier relay unit 4 and the wafer delivery unit 9 can be isolated from each other by the plate 15, with the result that, even when an abnormality has taken place in the atmosphere within the cleaning processing section 3 due to a leakage of the process liquid from the process chamber 26, the abnormal atmosphere is prevented from being expanded into the carrier relay unit 4 through the wafer delivery unit 9. Therefore, it is possible to avoid the contamination within the carrier relay unit 4. Such being the situation, it is desirable that the carrier transfer port 14a is kept closed and that the carrier transfer port 14a is opened only when the carrier C is transferred therethrough.

The wafer W is transferred from the carrier relay unit 4 into the cleaning processing unit 3, for example, as follows. In the first step, the carrier transfer port 14a is opened. Then, inserted is the arm 17a holding the carrier C housing the wafers W into a predetermined position within the wafer delivery unit 9. Then, under this state, the wafer holding member 41 is moved upward so as to allow the wafers W within the carrier C to be held by the wafer holding member 41. Further, a wafer transfer port 19a referred to herein later is opened, and the wafer holding member 41 is moved upward to the predetermined position within the cleaning processing unit 3. Under this state, the wafers W are transported into a rotor 24 constituting a holding means of the wafers W housed in the process chamber 26. Then, the wafer holding member 41 is moved downward into the wafer delivery unit 9, and the wafer transfer port 19a is closed. After it has been confirmed that wafer holding member 41 is positioned below the arm 17a, the arm 17a is shrunk so as to bring the wafer holding member 41 back into the carrier relay unit 4, and the carrier transfer port 14a is closed.

Incidentally, when the wafer holding member 41 holding the wafers W is moved upward, a line sensor 44 monitors whether the number of wafers W is correct, whether there is a breakage in the wafers W, and whether the wafers W are held vertical, not oblique. If there is any abnormality, the processing is interrupted, or an alarm is generated.

The wafer transfer port 19a through which the wafers W and the wafer holding member 41 can be transferred is formed in the partition wall 19 provided on the side of the cleaning processing unit 3 in the housing 9. As denoted by an arrow S2 in FIG. 3A, the wafer transfer port 19a can be closed by a plate 21 movable both in the horizontal direction and the vertical direction. The plate 21, which is movable both in the horizontal direction and the vertical direction as denoted by the arrow S2 shown in FIG. 3A, is moved in the vertical direction by, for example, an air cylinder (not shown) so as to be brought into a tight contact with the partition wall 19 with a seal member 22 interposed therebetween, with the result that the wafer transfer port 19a is hermetically closed.

The interior of the housing 9a is isolated from the interior of the cleaning processing unit 3 by hermetically closing the wafer transfer port 19a by using the plate 21. As a result, even when an abnormality has taken place in the atmosphere within the cleaning processing unit 3 by, for example, the leakage of the process liquid from the process chamber 26 within the cleaning processing unit 3, it is possible to prevent the abnormal atmosphere from being expanded into the housing 9a so as to contaminate the wafer delivery unit 9. It is also possible to avoid the damages to the various mechanisms and the members within the housing 9a. Accordingly, it is desirable to open the wafer transfer port 19a only when the wafers W are transferred, and to keep the wafer transfer port 19a closed during, for example, the liquid processing using the process chamber 26.

The cleaning processing unit 3 will now be described. The cleaning processing unit 3 is used for removing, for example, the resist mask and the polymer layer, which are etching residues, after the etching treatment of the wafers W so as to clean the wafers W. The cleaning processing unit 3 includes a housing 3a and various members for using the liquid processing such as a process chamber 26 arranged within the housing 3a.

The housing 3a is constituted the partition wall 19, the plate 21 closing the wafer transfer port 19a formed in the partition wall 19, the process chamber 26 arranged therein is surrounded by the partition wall 14b (see FIG. 3A) mounted on the side of the first vertical wall 31, the partition wall 25 extending in the vertical direction, a ceiling wall 25b extending in the horizontal direction, the side wall providing the boundary between the power source unit 7 and the chemical tank box 8, and another side wall facing the particular side wall noted above and constituting a part of the outer wall of the cleaning processing apparatus 1.

Figure 4:
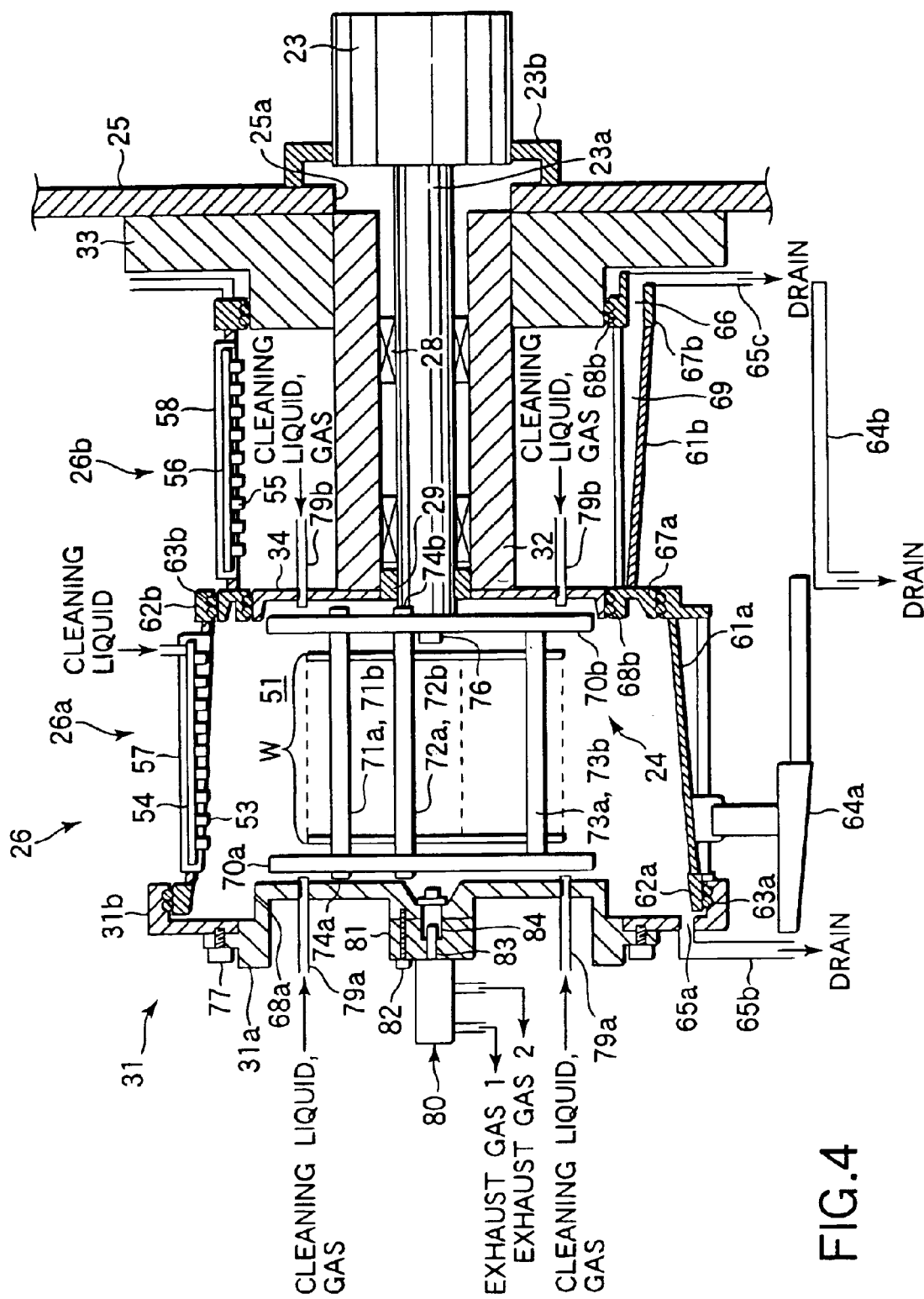
FIG. 4 is a cross sectional view showing a process chamber arranged in the cleaning processing unit shown in FIG. 3A.

A hole 25a as shown in FIG. 4 is formed in a partition wall 25 and a rotary shaft 23a is arranged horizontal in a manner to extend through the hole 25a. A motor 23 is fixed to the partition wall 25 by using a fixing tool 23b. The rotor 24 is mounted to the end of the rotary shaft 23a within the housing 3a. The motor 23 is mounted to another end of the rotary shaft 23a outside the housing 3a. As a result, the rotor 24 is rotated by the rotary driving force of the motor 23.

The rotary shaft 23a is surrounded and supported by a cylindrical support cylinder 32 that is mounted to a second vertical wall 34. A bearing 28 is arranged between the support cylinder 32 and the rotary shaft 23a, and the clearance between the second vertical wall 34 and the tip portion of the support cylinder 32 is sealed by a labyrinth seal 29. As a result, the particles or the like generated in the clearance between the rotary shaft 23a and the support cylinder 32 in accordance with the rotation of the rotary shaft 23a are prevented from being diffused within the housing 3a.

An engaging member 33 engaged with the inside chamber 26b is mounted on the side of the motor 23 of the support cylinder 32. The engaging member 33 is fixed to the partition wall 25. The motor 23 is arranged outside the housing 3a so as to prevent the particles or the like generated in the motor 23 from entering the housing 3a, with the result that it is possible to suppress the contamination of the housing 3a.

As described above, the housing 3a is constructed not to be contaminated so as to reduce the load of the cleaning and the maintenance within the housing 3a. Further, even when the process liquid leaks from the process chamber 26, the motor 23 is not affected by the leaking process liquid and, thus, the life of the motor 23 can be prolonged.

The rotor 24 comprises disks 70a and 70b. Engaging members 71a, 71b, 72a and 72b are stretched between the disks 70a and 70b. Further, a plurality of wafers W, e.g., 26 wafers W, which are held vertical by wafer holding members 73a, 73b, are arranged in the horizontal direction within the rotor 24.

The disk 70b is mounted to the rotary shaft 23a by using, for example, four screws 76. If the motor 23 is rotated, the rotor 24 is rotated together with the wafers W held therein via the rotary shaft 23a. Also, the engaging members 71a, 71b, 72a, 72b can be fixed to the disks 70a, 70b by using, for example, screws 74a, 74b. Incidentally, in FIGS. 4 and 5, the engaging members 71b, 72b are positioned behind the engaging members 71a, 72a, respectively. Likewise, the wafer holding member 73b is positioned behind the wafer holding member 73a.

The outside chamber 26a as shown in FIG. 4 arranged to surround the rotor 24 includes a cylindrical body 61a and ring members 62a, 62b mounted to the edge surfaces of the cylindrical body 61a. In the cylindrical body 61a, the outer diameter on the side of the ring member 62a is made larger than the outer diameter on the side of the ring member 62b. The outside chamber 26a is slidable between the retreat position shown in FIG. 3A and the process position shown in FIG. 4.

Figure 5:
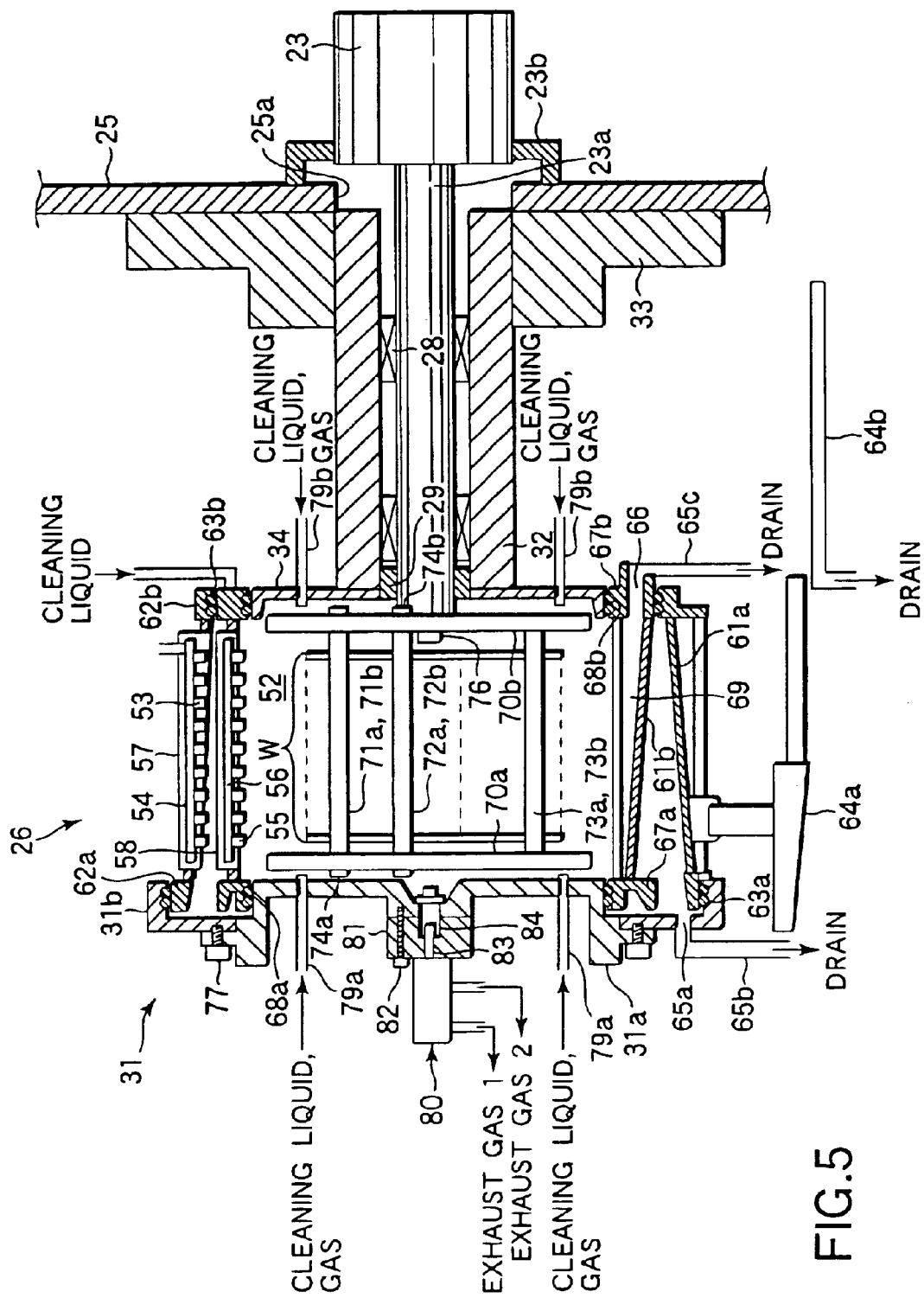
FIG. 5 is another cross sectional view showing a process chamber arranged in the cleaning processing unit shown in FIG. 3A.

On the other hand, the inside chamber 26b includes a cylindrical body 61b having an outer diameter smaller than that of the cylindrical body 61a and ring members 67a, 67b mounted to the edge surfaces of the cylindrical body 61b, and is slidable between the retreat position shown in FIGS. 3A and 4 and the process position shown in FIG. 5. During delivery of the wafers W, both the outside chamber 26a and the inside chamber 26b are in the retreat positions as shown in FIG. 3A.

Incidentally, when the outside chamber 26a is in the retreat position, the inside chamber 26b is generally controlled to be in the retreat position, but not in the process position. One of the reasons for this particular mechanism resides in the construction and arrangement of the slide mechanism for holding and sliding the outside chamber 26a and the inside chamber 26b. Another reason is to avoid the collision of a drain pipe 65c arranged in a lower portion of the inside chamber 26b with the outside chamber 26a.

As shown in FIG. 4, when the outside chamber 26a is in the process position, the clearance between a frame member 31b and the ring member 62b is sealed by a seal member 63a, and the clearance between the ring member 62b and the ring member 67a is sealed by a seal member 63b. Incidentally, the frame member 31b is one of the constituents of a first vertical wall 31 and is joined and fixed to the housing 3a, while the seal member 63a is mounted to the frame member 31b, and the seal member 63b is mounted to the ring member 62b.

As shown in FIG. 4, when the inside chamber 26b is in the retreat position, the clearance between the ring member 67a and the edge surface of the second vertical wall 34 is sealed by a seal member 68a, and the clearance between the ring member 67a and the ring member 62b is sealed by the seal member 63b. The clearance between the ring member 67b and the engaging member 33 is sealed by a seal member 68b.

Where the inside chamber 26b is moved to the process position as shown in FIG. 5, the clearance between the ring member 67a and the horizontal portion of a member 31a for closing a opening of the process chamber 52 is sealed by the seal member 68a, the clearance between the ring member 67b and the edge surface of the second vertical wall 34 is sealed by the sealing member 68b, and the clearance between the ring member 67b and the ring member 62b is sealed by the seal member 63b. Incidentally, the member 31a is one of the members constituting the first vertical wall 31, the seal member 68a is mounted to the ring member 67a, and the seal member 68b is mounted to the ring member 67b.

As shown in FIG. 4, the portion where the ring member 62b, etc. are arranged via the seal members 63a, 63b, 68b, 68b has a sealing structure. Therefore, when the outside chamber 26a is in the process position and the inside chamber 26b is in the retreat position, a closed process space 51 is formed by the first vertical wall 31, the second vertical wall 34, the cylindrical body 61a, and the ring members 62a, 62b, and 67a. When both the outside chamber 26a and the inside chamber 26b are in the process position as shown in FIG. 5, a closed process space 52 is formed by the member 31a, the second vertical wall 34, the cylindrical body 61b, and the ring members 67a, 67b.

A cleaning liquid spurting nozzle 54 includes a large number of cleaning liquid spurting ports 53 arranged in the horizontal direction. The cleaning liquid spurting nozzle 54 is housed in a nozzle case 57 in an upper portion of the cylindrical body 61a. A cleaning liquid such as a pure water, IPA and various chemical liquids and a drying gas such as a nitrogen gas ($N_2$) are supplied from a cleaning liquid supply source such as the chemical tank box 8 to the cleaning liquid spurting nozzle 54 so as to be spurted from the cleaning liquid spurting ports 53 onto the wafers W held in the rotor 24.

Further, a cleaning liquid spurting nozzle 56 includes a large number of cleaning liquid spurting ports 55 arranged in the horizontal direction. The cleaning liquid spurting nozzle 56 is housed in a nozzle case 58 in an upper portion of the cylindrical body 61b. A cleaning liquid such as a pure water, IPA and various chemical liquids and a drying gas such as a nitrogen gas ($N_2$) are supplied from a cleaning liquid supply source such as the chemical tank box 8 to the cleaning liquid spurting nozzle 56 so as to be spurted from the cleaning liquid spurting ports 55 onto the wafers W held in the rotor 24. Only one cleaning liquid spurting nozzle 54 and only one cleaning liquid spurting nozzle 56 are shown in each of FIGS. 3A, 4 and 5. However, a plurality of each of the cleaning liquid supply nozzles 54 and 56 may be arranged. Further, it is not absolutely necessary to arrange these cleaning liquid supply nozzles 54 and 56 right above the cylindrical bodies 61a and 61b, respectively.

The bottom portion of the cylindrical body 61a is inclined downward toward the first vertical wall 31a. When the cleaning treatment is performed within the process space 51 defined by the outside chamber 26a, the cleaning liquid spurted from the cleaning liquid spurting nozzle 54 into the process space 51 is discharged to the outside through a hole 65a formed in a lower portion of the frame member 31b and the drain pipe 65b formed to communicate with the hole 65a.

Liquid receptacles 64a, 64b are formed below the cylindrical body 61a so as to collect the liquid even when the liquid drips from within the outside chamber 26a when the outside chamber 26a is slid between the process position and the retreat position. It follows that it is possible to prevent the inner space of the housing 3a from being contaminated with the dripping cleaning liquid.

The dripping of the cleaning liquid from within the outside chamber 26a takes place on the side of the ring member 62a that is low in height. Therefore, the cleaning liquid collected in the liquid receptacle 64a below the ring member 62a flows into the liquid receptacle 64b so as to be discharged to the outside through the drain pipe. Further, the discharge port of the process liquid from the liquid receptacle 64a (right edge of the liquid receptacle 64a shown in FIG. 4) is kept positioned above the liquid receptacle 64b within the slidable range of the outside chamber 26a.

On the other hand, a groove portion 69 having an inclining bottom surface is formed in a lower portion of the cylindrical body 61b in a manner to protrude from the cylindrical body 61b. The lower side of the groove portion 69 communicates with a discharge port 66 formed in a lower portion of the ring member 67b, and the drain pipe 65c is connected to the discharge port 66. In the cleaning treatment performed in the process space 52 as shown in FIG. 5 defined by the inside chamber 26b, the various cleaning liquids spurted from the cleaning liquid spurting nozzle 56 flow from the groove portion 69 into the drain pipe 65c through the discharge port 66.

Pure water spurting nozzles 79a are formed in two portions of the member 31a so as to spurt a pure water against that surface of the disk 70a which faces the member 31a so as to clean the disk 70a. Also, pure water spurting nozzles 79b are formed in two portions of the disk 70b so as to clean that surface of the disk 70b which faces the second vertical wall 34. The pure water spurted from these pure water spurting nozzles 79a and 79b is discharged to the outside through one of the drain pipes 65b and 65c in accordance with the formed process spaces 51 and 52.

It is possible for a cleaning liquid such as IPA to be spurted from the pure water spurting nozzles 79a, 79b. Further, it is possible to use these pure water spurting nozzles 79a, 79b for the purpose of supplying an atmosphere adjusting gas such as a nitrogen gas ($N_2$), an argon gas (Ar), a carbon dioxide gas ($CO_2$) or an oxygen gas ($O_2$) into the process space 51 or 52. As described herein later, the atmosphere adjusting gas supplied into the process space 51 or 52 is discharged to the outside through a gas exhaust mechanism 80 mounted to the member 31a, as shown in FIGS. 4 and 5. A cleaning liquid supply pipe (not shown) can be easily mounted to and detached from the pure water spurting nozzle 79a mounted to the member 31a. Also, it is desirable to construct such a system that a process liquid supply pipe (not shown) or a gas supply pipe (not shown) can be easily mounted to and detached from the pure water spurting nozzle 79a, because the member 31a can be easily opened or closed.

Figure 6:
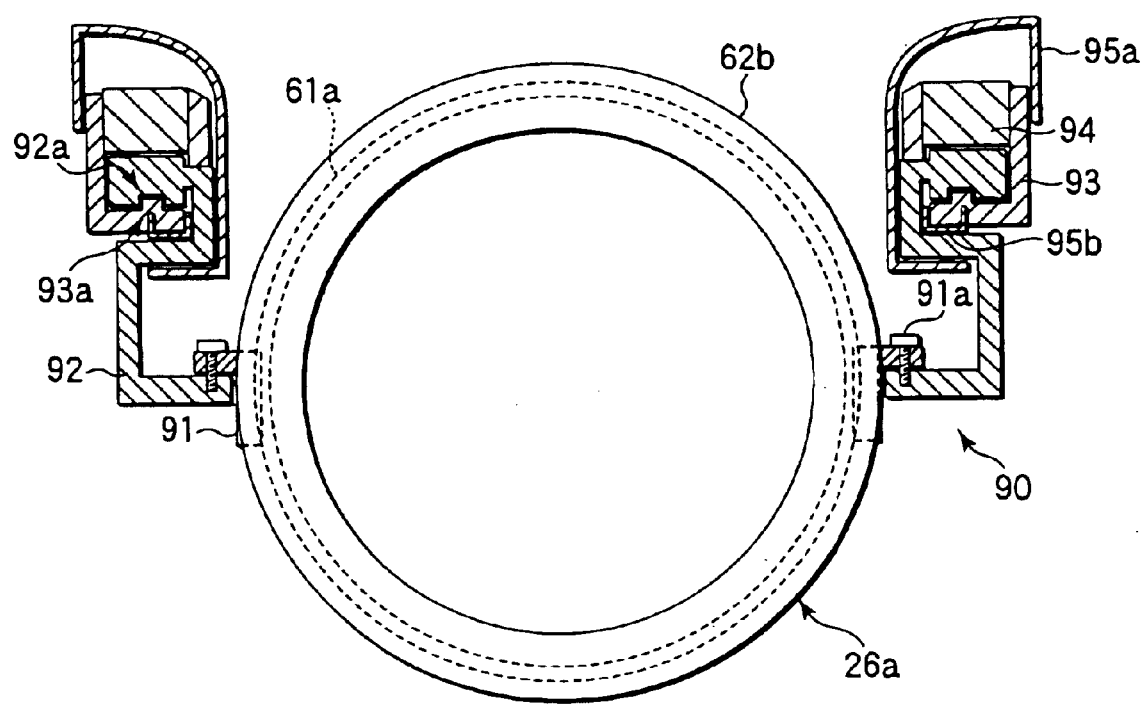
FIG. 6 is a front view showing the slide mechanism of an outside chamber constituting a process chamber.
Figure 7:
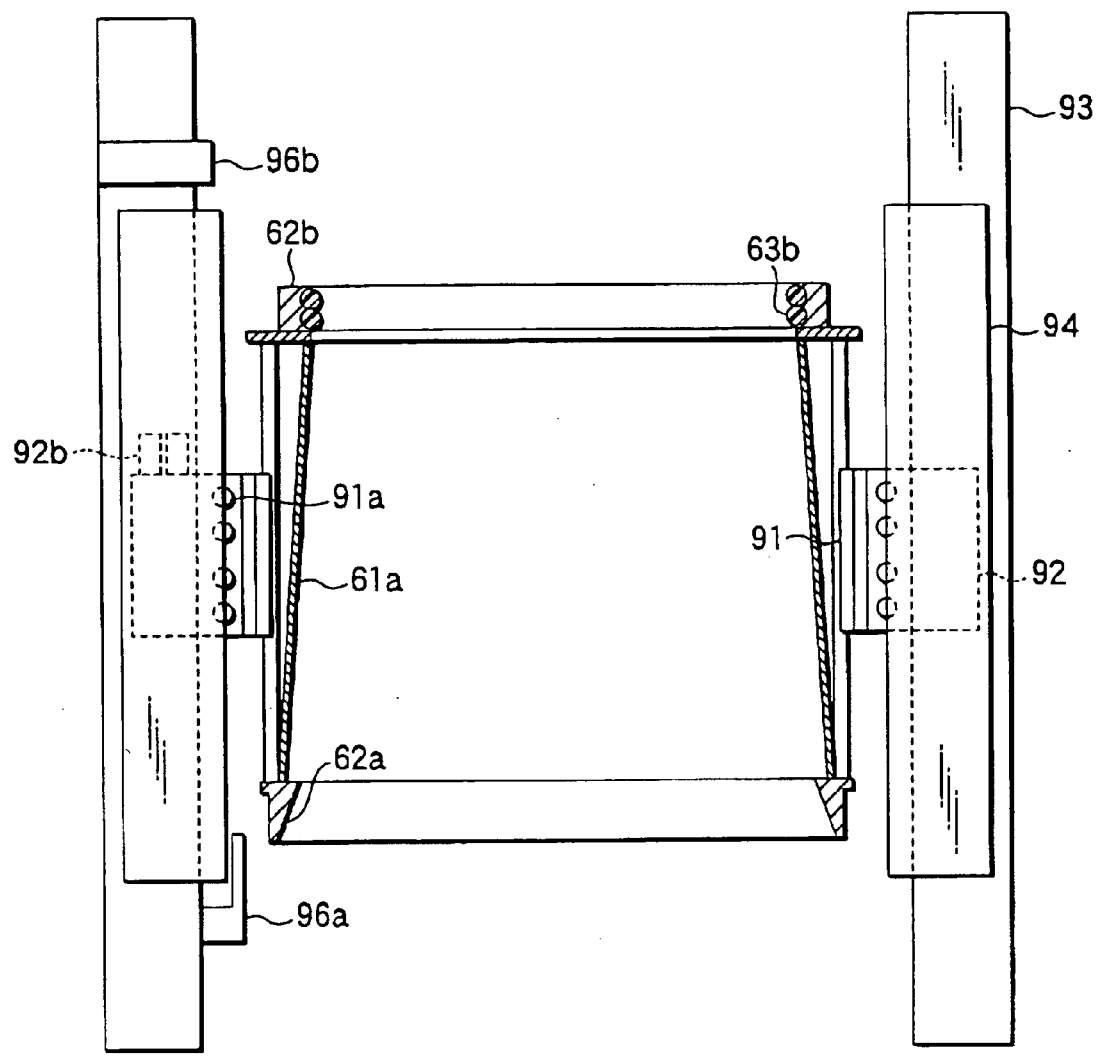
FIG. 7 is a cross sectional view showing the slide mechanism of an outside chamber constituting a process chamber.

The slide mechanism will now be described with reference to FIG. 6, with the outside chamber 26a taken as an example. FIG. 6 is a front view showing a slide mechanism 90 and the outside chamber 26a, and FIG. 7 is a plan view of the structure shown in FIG. 6. The slide mechanism 90 includes a guide 93 having a convex portion 93a formed to extend in the longitudinal direction of the guide 93, a linear driving mechanism 94 such as an air cylinder, and a connecting tool 92 having a concave portion 92a formed to be engaged with the convex portion 93a and joined to the linear driving mechanism 94 so as to be moved in the longitudinal direction of the guide 93. The edge portion in the longitudinal direction of the guide 93 can be fixed to, for example, a frame of the housing 3a.

In order to prevent the diffusion of the particles or the like generated from the linear driving mechanism 94, a cover 95a having a sealing structure is mounted to the linear driving mechanism 94. Further, a seal member 95b is mounted to the guide 93 in order to prevent the diffusion of the particles or the like generated from the engaging portion between the concave portion 92a and the convex portion 93a.

A cylindrical holding tool 91 is fixed to the cylindrical body 61a, and the cylindrical holding tool 91 is fixed to the connecting tool 92 by a screw 91a. Thus, the outside chamber 26a can be slid in the longitudinal direction of the guide 93 by driving the linear driving mechanism 94.

Stoppers 96a and 96b are mounted to one of the guides 93. The stopper 96a abuts against the connecting tool 92 so as to position the outside chamber 26a in its process position. On the other hand, the stopper 96b abuts against an abutting unit 92b so as to position the outside chamber 26a in its retreat position.

Since the cylindrical holding tool 91 can be easily joined to the connecting tool 92 by simply using the screw 91a, the outside chamber 26a can be easily detached from the connecting tool 92. It is also possible to employ a pin or an engaging structure in place of the screw 91 for joining the cylindrical holding tool 91 to the connecting tool 92. Further, the slide mechanism of the inside chamber 26b can be constructed like the slide mechanism 90 of the outside chamber 26a by arranging, for example, a guide in the clearance between the outside chamber 26a and the inside chamber 26b.

Figure 8:
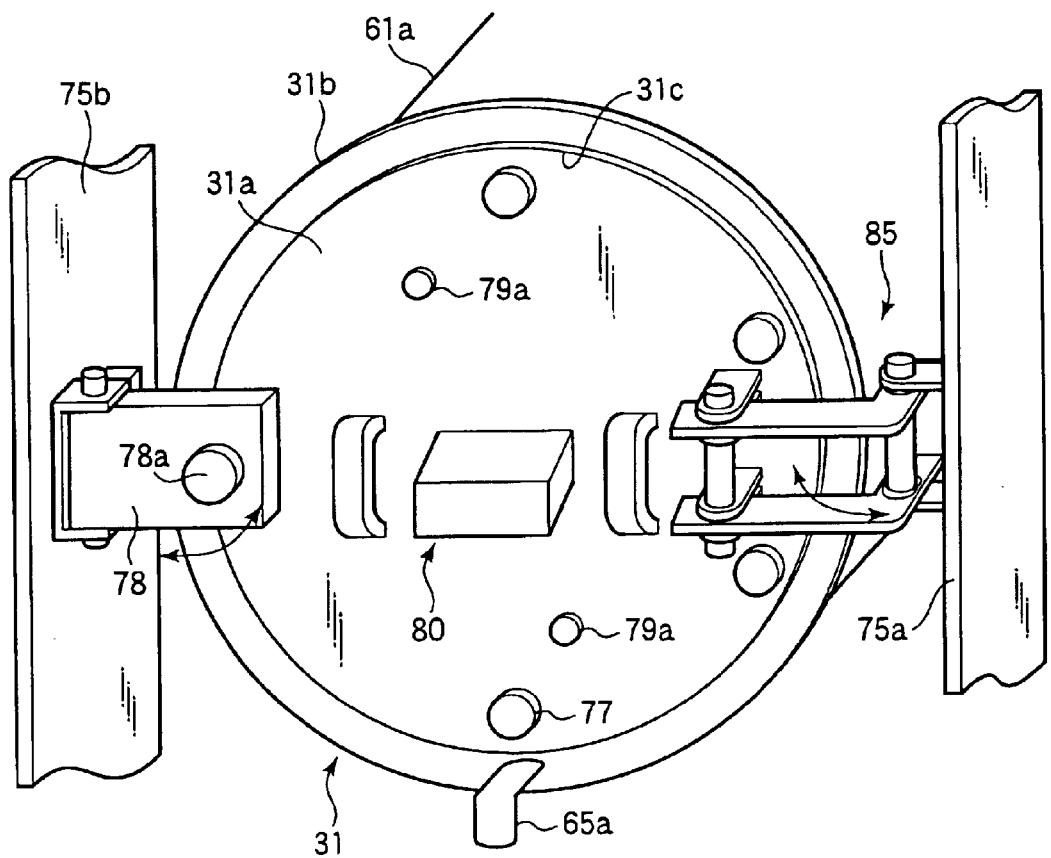
FIG. 8 is an oblique view showing a member 31a for closing an opening of the process chamber.

The structure of the first vertical wall 31 will now be described in detail with reference to FIGS. 4 and 5 as well as FIG. 8 presenting an oblique view of the first vertical wall 31 as viewed from the side of the carrier relay unit 4. The first vertical wall 31 comprises the member 31a and the frame member 31b. The gas exhaust mechanism 80 is formed in the member 31a.

A frame 75a, which is a part of the frame of the housing 3a, is joined to the member 31a by using a hinge mechanism 85. The hinge mechanism 85 allows the member 31a to open or close a window portion or opening 31c formed in the frame member 31b. To be more specific, it is possible to move the member 31a in the horizontal direction by a predetermined distance in the vicinity of the window portion or opening 31c. By the rotating motion about the hinge mechanism 85, the member 31a can be retreated to a position at which the window portion or opening 31c is rendered fully open. When the window portion 3c is fully open, the member 31a does not shield the window portion 31c so as to allow the entire window portion 31c to be seen open.

A rotatable fixing tool 78 is mounted to a frame 75b mounted to face the frame 75a. By fastening a bolt 78a of the fixing tool 78 to the frame member 31b with the member 31a interposed therebetween, the member 31a can be brought into a tight contact with the frame member 31b so as to hermetically close the window portion or opening 31c. Further, the member 31a is fixed to the frame member 31b without fail by using bolts 77 in several points, i.e., in four points in the drawing.

The gas exhaust mechanism 80 formed in the member 31a includes two systems of gas exhaust lines, i.e., exhaust lines 1 and 2 shown in each of FIGS. 4 and 5. These exhaust lines 1 and 2 are suitably used depending on the atmospheres within the process spaces 51, 52 and the kinds of the chemical liquids used. The exhaust gas discharged from within the process spaces 51, 52 passes through pipe members 83, 84 so as to be discharged to the outside from the predetermined gas exhaust line. A pipe holding member 81 attached to the pipe member 83 can be easily removed from the member 31a by withdrawing a pin 82 fixing the pipe holding member 81 to the member 31a. Thus, the pipe members 83 and 84 can be easily detached while maintaining the sealed state.

When the member 31a is moved for opening or closing the window portion or opening 31c, it is possible to detach and retreat easily the gas exhaust mechanism 80 so as to prevent the pipe, etc. of the gas exhaust mechanism 80 from obstructing the movement of the member 31a, thereby moving easily the member 31a, while the pipe holding member 81 can be easily mounted to a predetermined position of the member 31a hermetically closing the window portion 31c.

As shown in FIG. 3A, a fire sensor 50 detecting the occurrence of a fire within the housing 3a is arranged within the cleaning processing unit 3. If a fire is detected by the fire sensor 50, a fire extinguishing chemical material or a fire extinguishing gas is spurted from a fire extinguishing mechanism (not shown). Such a fire may possibly occur, when, for example, the rotated wafer is broken, scattered around, and damages the surrounding part during the cleaning treatment using a combustible solvent such as IPA. In the present invention, however, the wafer transfer port 19a can be hermetically closed by the plate 21 and, thus, the accident within the housing 3a is unlikely to affect the other units such as the wafer delivery unit 9, as described previously.

A filter fan unit (FFU) 20 is arranged in an upper portion of the housing 3a so as to supply a clean air into the cleaning processing unit 3. The clean air supplied into the cleaning processing unit 3 is discharged to the outside through an exhaust port 27 formed in the partition wall 25. As described previously, the wafer transfer port 19a is hermetically closed by the plate 21, and the clearance between the rotary shaft 23a extending through the partition wall 25 and the partition wall 25 is hermetically sealed. It follows that the atmosphere within the housing 3a is discharged to the outside only through the exhaust port 27. As a result, it is possible to control easily the atmosphere within the cleaning processing unit 3.

As described above, the housing 3a has a hermetic structure under the state that the wafer transfer port 19a is hermetically closed so as to be substantially shielded from the outside. In other words, the cleaning processing apparatus 1 is designed in such a manner that the atmosphere within the housing 3a is unlikely to be propagated into the other process units of the cleaning processing apparatus 1 such as the wafer delivery unit 9, the carrier relay unit 4 and the power source unit 8. As a result, when, for example, the cleaning liquid leaks from the joint portions or sealing portions of the constituting members of the process chamber 26, or when the rotating wafer W is broken and the broken pieces of the wafer W are scattered so as to do damage to the process chamber 26, thereby causing leakage of the cleaning liquid from the broken portions, it is possible to avoid such an accident that the leaking cleaning liquid flows into the other process sections such as the wafer delivery unit 9 so as to be diffused and, thus, to do damage to the wafer delivery unit 9.

Further, when a fire has taken place within the housing 3a, it suffices to extinguish the fire only within the cleaning processing unit 3, and it is possible to prevent the other process sections within the cleaning processing apparatus 1 from catching fire. Naturally, it is also possible to prevent the diffusion of the fire extinguishing chemical material within the cleaning processing apparatus 1.

As described above, even when an accident such as damages to the wafer W or to the device such as the process chamber 26 has taken place within the housing 3a, it is possible to prevent the damages from being expanded like a chain reaction to the other process sections constituting the cleaning processing apparatus 1. Therefore, the entire cleaning processing apparatus 1 can be restored by restoring only the cleaning processing unit 3 which was actually damaged. As a result, the restoring time of the cleaning processing apparatus 1 can be reduced, and the number of parts to be replaced is reduced, thereby leading to the reduction of the cost required for the restoration of the cleaning processing apparatus 1.

It should also be noted that, if the housing 3a is allowed to have a hermetic structure, the housing 3a is unlikely to be affected by the other process units and by the external environment, making it possible to maintain easily the inner region of the housing 3a under a predetermined environment. It follows that it is possible to rise the temperature within the housing 3a in the case of using, for example, a high temperature process liquid so as to suppress the cooling of the process liquid within the housing 3a. As a result, the process liquid can achieve its characteristics sufficiently, thereby achieving the liquid processing more effectively.

Next, the access to the process chamber 26 and the rotor 24 arranged within the housing 3a will now be described. The side wall panel of the carrier relay unit 4 denoted by an arrow A1 in FIG. 2 is detachable so as to make it possible for the workers, operating machines, cleaning machines, etc. to access easily the inner region of the carrier relay unit 4. A partitioning side wall 14b provided on the side of the carrier relay unit 4 within the housing 3a is also detachable. It is possible to gain access from the side of the carrier relay unit 4 (front side of the cleaning processing unit 3) to the inner region of the housing 3a by detaching the side wall panel 14b.

Under the state that the side wall panel 14b is detached, it is possible to move the member 31a so as to open the window portion or opening 31c. As a result, it is possible to gain access to the disk 70a of the rotor 24 from the window portion 31c so as to attach and detach, for example, the screw 74a easily. Further, as described herein later, it is possible to detach easily the rotor 24 by the access from the side region of the process chamber 26. Therefore, if the outside chamber 26a is arranged in the process position under the state that the rotor 24 is detached, it is possible to gain access easily to the inner region of the outside chamber 26a through the window portion 31c for maintenances. Further, when the inside chamber 26b is arranged in the process position, it is of course possible to perform easily the maintenance of the inner region through the window portion 31c.

Figure 3B:
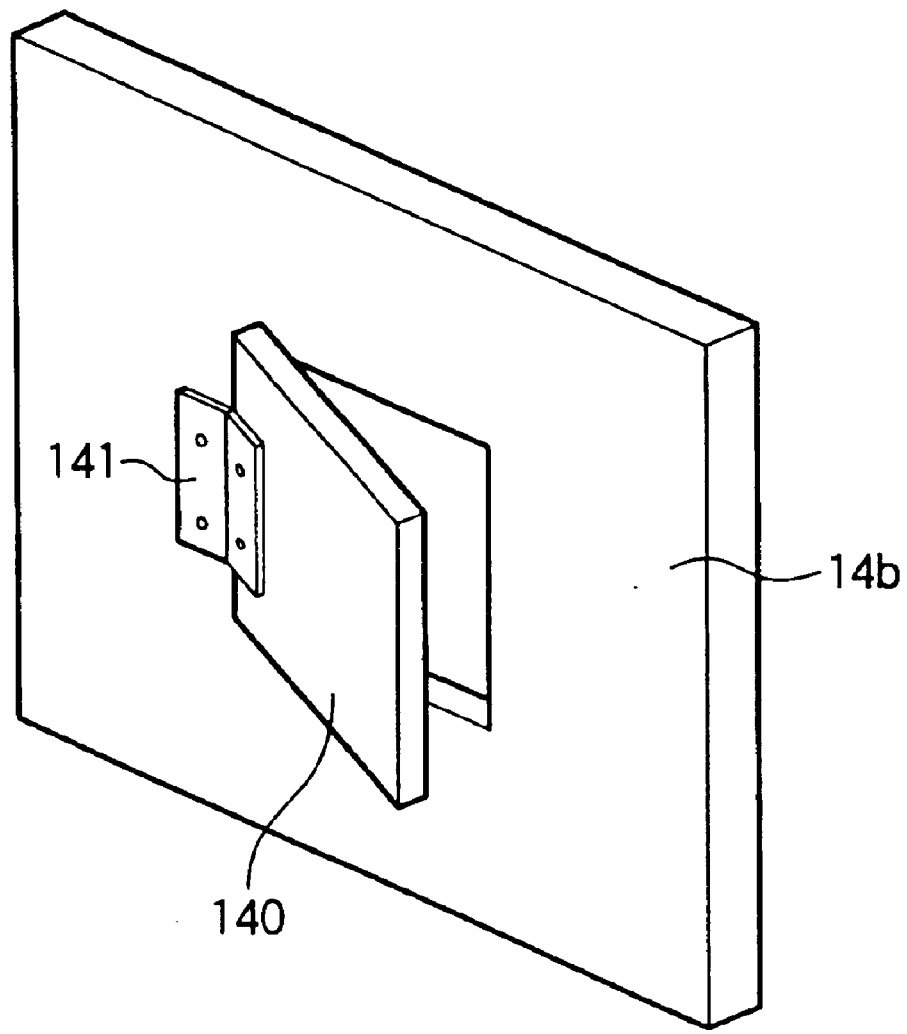
FIG. 3B is an alternative side wall panel with an window portion arranged between the carrier relay unit 4 and the cleaning processing unit in the cleaning processing apparatus.

Further, the side wall panel 14b may have a window portion, if it is not detachable, as shown in FIG. 3B. An exemplary window portion as shown in FIG. 3B is opened or closed by a cover plate 140 connected with the side wall panel 14b by a hinge 141. The cover plate 140 is hermetically sealed by sealing means (not shown).

In the cleaning processing apparatus 1, it is possible to gain access to the inner region of the cleaning processing unit 3 from the front region of the process chamber 26, as described previously. In addition, the side panel of the housing 3a constituting the cleaning processing unit 3 denoted by an arrow A2 in FIG. 2 is detachable. It follows that it is possible to gain access easily to the inner region of the housing 3a from the sideward direction of the cleaning processing unit 3 by detaching the side wall panel noted above. Incidentally, it is also possible to gain access easily to a wafer delivery mechanism 40 from the sideward direction by detaching the side wall panel.

For example, since the rotor 24 is fixed to the rotary shaft 23a by using the screw 76 as described previously, it is possible to attach easily the rotor 24 to the rotary shaft 23a or detach easily the rotor 24 from the rotary shaft 23a by moving the outside chamber 26a and the inside chamber 26b to the retreat positions so as to gain access to the screw 76 from the sideward direction of the cleaning processing unit 3.

Further, since it is possible to gain access to the wafer delivery mechanism 40 from the sideward direction, the adjustment of the delivery position of the wafer W is easily adjusted between the wafer holding member 41 and the rotor 24 from the sideward direction. Similarly, it is possible to attach and detach the outside chamber 26a and the inside chamber 26b and to gain access to the various piping materials, which are not shown in FIGS. 3A, 4 and 5, mounted to the outer circumferential surfaces of the outside chamber 26a and the inside chamber 26b from the sideward direction. Of course, these operations can be performed more easily by the access from the forward direction of the cleaning processing unit 3 described previously.

As described above, the cleaning processing apparatus 1 of the present invention is designed in such a manner that it is possible to gain access to the inner region of the cleaning processing unit 3 in two directions, i.e., from the front region and the side region of the cleaning processing unit 3. This is particularly excellent in terms of easy maintenances, compared with such a case that the maintenance operation cannot be performed by an access in one direction. Further, the maintenance operation can be performed efficiently, since it is possible to select a suitable access direction depending on the specific operation performed in the housing 3a. Further, when various types of the maintenance is performed in this fashion, a minute processing can be performed in detail. Such a satisfactory maintenance capability can be further enhanced by using the sliding type process chamber 26.

Incidentally, the cleaning processing apparatus 1 of the present invention is a combination of a plurality of process units. Therefore, it is also possible to gain access to the inner region of the housing 3a by, for example, moving the power source unit 7 and the chemical tan box 8 positioned adjacent to the cleaning processing unit 3 and detaching the side wall panel of the housing 3a forming the boundary between with the power source unit 7 and the chemical tank box 8.

Figure 9:
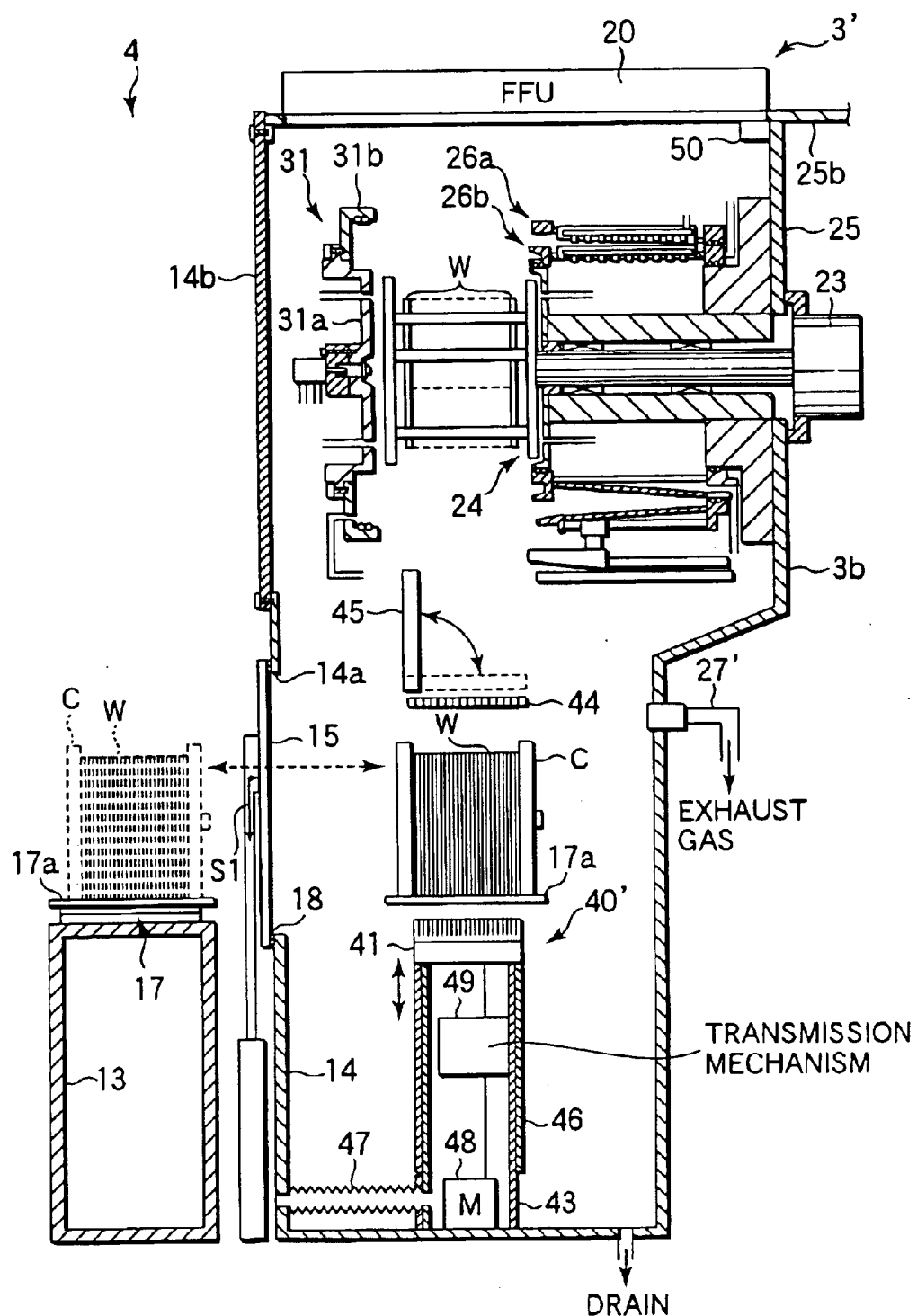
FIG. 9 is a cross sectional view showing the construction in another mode in respect of a carrier relay section, a wafer delivery section and a cleaning processing unit included in the cleaning processing apparatus shown in FIG. 1.

Another embodiment of the cleaning processing unit 3 will now be described. FIG. 9 is a cross sectional view schematically showing a cleaning processing unit 3'. The cleaning processing unit 3' is formed the cleaning processing unit 3 and the wafer delivery unit 9 as an integral unit without separating the cleaning processing unit 3 from the wafer delivery unit 9 by the partition wall 19. The process chamber 26 and the wafer delivery mechanism 40', etc., are arranged within the housing 3b. The plate 15 and is brought into tight contact with the partition wall 14 so as to close the carrier transfer port 14a, thereby shielding the cleaning processing unit 3' from the outside and, thus, forming a hermetic structure.

A wafer delivery mechanism 40' is arranged within the housing 3b. The wafer delivery mechanism 40' includes a cylindrical support column 43, a cylinder 46 holding a wafer holding member 41 and engaged with the support column 43, and a motor 48 arranged within the support column 43. Further, a transmission mechanism 49 is arranged within the cylinder 46 so as to transmit the rotation of the motor 48 to the cylinder 46, thereby moving the cylinder 46 by a predetermined distance in the vertical direction.

The support column 43 and the cylinder 46 prevents the cleaning liquid used in the cleaning processing unit 3' from entering the inner region of these support column 43 and the cylinder 46 so as to protect the motor 48 from the cleaning liquid. Further, the power source cable of the motor 48 is extended within bellows 47 communicating with the inner region of the support column 43 so as to isolate the power source cable from the cleaning liquid used in the cleaning processing unit 3'.

A protective plate 45 for protecting the wafer holding member 41 is arranged within the housing 3b. The protective plate 45 is held to assume a vertical posture as denoted by a solid line in FIG. 9 so as not to obstruct the vertical movement of the wafer holding member 41 when the wafer holding member 41 is moved in the vertical direction. Further, the protective plate 45 is held to assume a horizontal posture as denoted by a dotted line in FIG. 9 under the state that the wafer holding member 41 is in the lower waiting position so as to prevent the wafer holding member 41 from being contaminated with, for example, the cleaning liquid dropping from the process chamber 26 or to prevent the wafer holding member 41 from being damaged by the wafer W or the broken pieces of the wafer W when the wafer W or the broken pieces thereof fall down.

A drain pipe is arranged in the bottom wall of the housing 3b. When the cleaning liquid drops from the process chamber 26, the dropping cleaning liquid is discharged to the outside through the drain pipe. Further, an exhaust port 27' is formed in the partition wall 25. Further, a stepped portion is formed between the upper portion and the lower portion of the partition wall 25. It is possible to arrange various pipes such as a liquid supply pipe, a liquid discharge pipe and an exhaust pipe by utilizing the free space outside the lower portion of the partition wall 25.

The present invention is not limited to each of the embodiments described above, and it is possible to modify the embodiments described above in various fashions. In the embodiments described above, the cleaning and drying treatments are performed by using two process chambers, i.e., the outside chamber 26a and the inside chamber 26b. However, it is also possible to use three or more process chambers or to use a single process chamber. Further, it is possible to use any of the outside chamber 26a and the inside chamber 26b for the cleaning treatment or the drying treatment. It is also possible to use the outside chamber 26a and the inside chamber 26b for successively performing both the cleaning and drying treatments. Further, in each of the embodiments described above, the present invention is applied to the cleaning treatment. In addition, it is possible to apply the present invention to another liquid processing such as a coating treatment for coating a predetermined coating liquid, or to the treatment other than a liquid processing such as a CVD treatment or an etching treatment. Further, in each of the embodiments described above, the present invention is applied to the processing of a semiconductor wafer. In addition, it is possible to apply the present invention to the processing of other substrates such as a substrate for a liquid crystal display (LCD) device.

It should be noted that the embodiments described above are simply intended to clarify the technical idea of the present invention. Naturally, the technical scope of the present invention should not be construed solely on the basis of the specific embodiments described above. In other words, the present invention can be worked in variously modified fashions on the basis of the spirit of the present invention and within the scope defined in the accompanying claims.

What is claimed is:

1. A liquid processing apparatus, comprising:
    a liquid processing section for performing a liquid processing by supplying a predetermined process liquid to a target object while rotating the target object; and
    a housing for housing said liquid processing section;
    wherein said housing has a hermetic structure thereby to be substantially shielded from the outside;
    wherein said liquid processing section includes
        holding means for holding said target object,
        a process chamber for housing said holding means, and
        a process liquid supply nozzle for supplying a predetermined process liquid to said target object held by said holding means and,
        wherein said process chamber is slidable between a process position and a retreat position.

2. The liquid processing apparatus according to claim 1, wherein said process chamber is of a double wall structure comprising an inside chamber and an outside chamber.

3. The liquid processing apparatus according to claim 1, wherein said housing includes a target object delivery mechanism which is movable in the vertical direction thereby to deliver said target object to and receive said target object from said holding means.

4. The liquid processing apparatus according to claim 3, further comprising:
    a container delivery section for delivering a container capable of housing said target object; and
    a transfer mechanism for transferring said target object between said container delivery section and said target object delivery mechanism,
    wherein said housing includes:
        an open portion for delivering said target object to and from said container delivery section; and
        a shutter for opening/closing said open portion, and
        wherein said housing forms a hermetic structure under the state that said open portion is closed by said shutter thereby to be substantially shielded from the outside.

5. The liquid processing apparatus according to claim 3, further comprising:
    a container delivery section for performing the delivery of a container capable of housing said target object;
    a container relay section in which is arranged a first container transfer mechanism interposed between said housing and said container delivery section for transferring said container to and from said housing;
    an open portion for the transfer of the container, said open portion being formed in a partition wall formed between said liquid processing chamber and said container relay chamber for transferring the container between the liquid processing chamber and the container relay chamber;
    a shutter for hermetically closing said open portion for transferring said container; and
    a second container transfer mechanism for transferring said container between said first container transfer mechanism and said container delivery section,
    wherein said housing forms a hermetic structure under the state that said shutter is closed thereby to be substantially shielded from the outside.

6. The liquid processing apparatus according to claim 3, wherein said target object delivery mechanism is arranged inside of said housing.

7. The liquid processing apparatus according to claim 3, further comprising:
    a container delivery section for performing the delivery of a container capable of housing said target object;
    a container relay section being interposed between said housing and said container delivery section and having a first container transfer mechanism for transferring said container into said housing thereby allowing said target object housed in said container to be delivered to said target object delivery mechanism;

a second container transfer mechanism for transferring said container between said first container transfer mechanism and said container delivery section;

an open portion formed in a partition wall provided on the side of said container relay section in said housing for the transfer of said container between the inside of said housing and said container relay section; and a shutter for opening/closing said open portion for transferring said container, wherein said housing forms hermetic structure under the state that said shutter is closed thereby being substantially shielded from the outside.

8. The liquid processing apparatus according to claim 1, further comprising:

an another housing positioned below said housing and including a target object delivery mechanism which is driven in the vertical direction thereby to deliver said target object to and from said holding means;

a first open portion formed in a partition wall arranged between said housing and said another housing for transferring said target object; and a first shutter for opening/closing said first open portion, wherein said housing forms a hermetic structure under the state that said first open portion is closed by said first shutter thereby to be substantially shielded from the outside.

9. The liquid processing apparatus according to claim 8, further comprising:

a container delivery section for delivering a container capable of housing said target object; and a container transfer mechanism for transferring said container between said container delivery section and said another housing, wherein said another housing includes:

a second open portion for delivering said container to and from said container delivery section; and a second shutter for opening/closing said second open portion, wherein each of said housing and said another housing forms a hermetic structure under the state that said first open portion is closed by said first shutter and said second open portion is closed by said second shutter thereby to be substantially shielded from the outside.

10. The liquid processing apparatus according to claim 8, further comprising:

a container delivery section for delivering a container capable of housing said target object;

a container relay section including a first container transfer mechanism for delivering said target object to and from said target object delivery mechanism, said first container transfer mechanism being interposed between said target object waiting chamber and said container delivery section;

a second container transfer mechanism for transferring said container between said first container transfer mechanism and said container delivery section; and an open portion for transferring said container, said open portion being formed in a partition wall arranged between said housing and said container relay section for transferring said container between said another housing and said container relay section, wherein each of said housing and said another housing forms a hermetic structure under the state that said first open portion is closed by said first shutter and said second open portion is closed by said second shutter thereby to be substantially shielded from the outside.

11. The liquid processing apparatus according to claim 8, further comprising a rotating mechanism for said holding means.

12. The liquid processing apparatus according to claim 8, further comprising:

a container delivery section for delivering a container capable of housing said target object;

a container relay section being interposed between said another housing and said container delivery section and having a first container transfer mechanism for transferring said container into said another housing thereby allowing said target object housed in said container to be delivered to said target object delivery mechanism;

a second container transfer mechanism for transferring said container transfer mechanism and said container delivery section;

a second open portion formed in a partition wall provided on the side of said container relay section in said another housing for transferring said container between the inside of said another housing and said container relay section; and a second shutter for opening/closing said second open portion, wherein each of said housing and said another housing forms a hermetic structure under the state that said first open portion is closed by said first shutter and said second open portion is closed by said second shutter thereby being substantially shielded from the outside.

13. The liquid processing apparatus according to claim 1, wherein said housing includes:

a filter fan unit for blowing clean air into said housing; and an exhaust mechanism for exhausting said housing thereby controlling the atmosphere within said housing.

14. The liquid processing apparatus according to claim 1, wherein said housing includes:

a fire detecting sensor for detecting a fire; and a fire extinguishing apparatus for dispersing a fire extinguishing material within said housing upon receipt of a signal generated from said fire detecting sensor.

15. The liquid processing apparatus according to claim 1, further comprising a rotating mechanism for said holding means.

16. A liquid processing apparatus for applying a predetermined liquid processing to a target object to be processed, comprising:

a cylindrical process chamber for housing the target object; and a liquid processing mechanism for performing a liquid processing by supplying a predetermined process liquid to said target object while rotating the target object housed in the process chamber, wherein it is possible to gain access to the liquid processing mechanism from at least its side wall, and wherein said process chamber is slidable between a process position and a retreat position, and it is possible to gain access to said liquid processing mechanism from its side surface by positioning said process chamber in said retreat position.

17. The liquid processing apparatus according to claim 16, wherein said process chamber is of a double wall structure including an outside chamber and an inside chamber.

18. A liquid processing apparatus for applying a predetermined liquid processing to a target object to be processed, comprising:
- a cylindrical process chamber for housing the target object; and
- a liquid processing mechanism for performing a liquid processing by supplying a predetermined process liquid to said target object while rotating the target object housed in the process chamber,
- wherein:
  - said cylindrical process chamber and said liquid processing mechanism are arranged within a casing;
  - at least one side wall panel forming said casing and positioned to face the side surface of said cylindrical process chamber includes a window portion or detachable side wall panel; and
  - it is possible to gain access to said liquid processing mechanism from said side surface by detaching said side wall panel or by opening said window portion.

19. The liquid processing apparatus according to claim 18, wherein it is possible to gain access to said liquid processing mechanism in two directions of its side wall and its front wall.

20. The liquid processing apparatus according to claim 18, wherein said cylindrical process chamber includes:
- a front wall having an opening; and
- a member for closing said opening,
- wherein it is possible to gain access to said liquid processing mechanism from said opening by moving said member.

21. The liquid processing apparatus according to claim 18, wherein:
- a housing includes a second side wall panel forming said housing and positioned to face an end face of said cylindrical process chamber, said second side panel being detachable or having a second openable/closeable window portion; and
- it is possible to gain access to said liquid processing section from a side of the second side wall panel.

22. The liquid processing apparatus according to claim 21, wherein:
- said cylindrical process chamber further includes a member for opening/closing an end face of said cylindrical process chamber on the end face of said cylindrical process chamber which faces said second side wall; and
- it is possible to gain access to the inside of said process chamber from the side of said second side wall panel by detaching said second side wall panel or by opening said second window portion, further, by moving said member to a predetermined position.

23. The liquid processing apparatus according to claim 21, wherein said process chamber is slidable between a process position for applying the liquid processing to said object and a predetermined retreat position.

24. A liquid processing apparatus for applying a predetermined liquid processing to a target object to be processed, comprising:
- a liquid processing section including a cylindrical process chamber for housing said target object and a liquid processing mechanism for performing a liquid processing by supplying a process liquid to said target object while rotating said target object;
- a container delivery section for delivering a container capable of housing said target object;
- a transfer mechanism for transferring said target object between said container delivery section and said liquid processing section; and
- a detachable panel between said container delivery section and said liquid processing section;
- wherein it is possible to gain access to the liquid processing mechanism from a sideward direction of said process chamber and from the direction of said container delivery section by detaching said detachable panel.

25. The liquid processing apparatus according to claim 24, wherein said liquid processing section further includes a front wall having an opening and a member for closing said opening, and wherein it is possible to gain access to the inner region of said cylindrical process chamber and to said liquid processing section from said opening by detaching said detachable panel and moving said member.

26. The liquid processing apparatus according to claim 24, further comprising:
- a target object delivery section including a target object delivery mechanism positioned below said liquid processing section and driven in the vertical direction for delivering said target object to and from said liquid processing mechanism;
- a container delivery section for delivering a container capable of housing said target object;
- a container relay section including a first container transfer mechanism for delivering said container to and from said target object delivery mechanism, said first container transfer mechanism being interposed between said target object delivery section and said container delivery section; and
- a second container transfer mechanism for transferring said container between said container relay section and said container delivery section.

27. The liquid processing apparatus according to claim 24, wherein:
- said cylindrical process chamber is slidable between a process position and a retreat position; and
- a slide mechanism for sliding said cylindrical process chamber is joined to said cylindrical process chamber by a screw, a pin or engagement thereby allowing said process chamber to be attached to or detached from said slide mechanism.

28. A liquid processing apparatus for applying a predetermined liquid processing to a target object to be processed, comprising:
- a cylindrical process chamber for housing the target object; and
- a liquid processing section for performing a liquid processing by supplying a predetermined process liquid to said target object while rotating the target object housed in the process chamber, wherein
  - said cylindrical process chamber is arranged within said liquid processing section;
  - said liquid processing section is arranged within a housing;
  - at least one first side wall panel forming said housing and positioned to face a side surface of said cylindrical process chamber has a first openable/closable window portion, or is detachable is detachable itself; and
  - it is possible to gain access to said liquid processing section from a side of said first side wall panel by detaching said first side wall panel or by opening said first window portion.

29. A liquid processing apparatus for applying a predetermined liquid processing to a target object to be processed, comprising:

a container delivery section for delivering a container capable for housing said target object;

a liquid processing section including a process chamber for housing said target object, said liquid processing section performing the predetermined liquid processing the predetermined liquid processing to said target object transferred from said container delivery section by supplying a process liquid to said target object while rotating said target object housed in said process chamber;

a housing for housing said liquid processing section;

a detachable panel forming housing said and facing said container delivery section; and at least one other detachable panel forming said housing perpendicular to said detachable panel.

30. The liquid processing apparatus according to claim 29, wherein said process chamber includes a member for opening/closing a side face of said process chamber on the side face of said process chamber which faces said detachable panel, and wherein it is possible to gain access to the inner region of said process chamber from a side of said container delivery section by detaching said detachable panel and by moving said member to a predetermined position.

31. The liquid processing apparatus according to claim 29, further comprising:

a target object delivery section being positioned below said liquid processing section and having a target object delivery mechanism driven in the vertical direction for delivering said target object to and from said liquid processing section;

a container relay section being interposed between said target object delivery section and said container delivery section and having a first container transfer mechanism for transferring said container to said target object delivery section thereby allowing said target object housed in said container to be delivered to said target object delivery mechanism; and a second container transfer mechanism for a transferring said container and said container delivery section.

32. The liquid processing apparatus according to claim 29, wherein:

said process chamber is slidable between a process position for applying the liquid processing to said target object and a predetermined retreat position; and a slide mechanism for sliding said process chamber is joined to said process chamber by a screw, a pin or engagement thereby allowing said process chamber to be attached to or detached from said slide mechanism.

\* \* \* \* \*